(12) United States Patent
Yen et al.

(10) Patent No.: US 11,848,296 B2
(45) Date of Patent: Dec. 19, 2023

(54) SEMICONDUCTOR DEVICE PACKAGE COMPRISING POWER MODULE AND PASSIVE ELEMENTS

(71) Applicant: Advanced Semiconductor Engineering, Inc., Kaohsiung (TW)

(72) Inventors: Han-Chee Yen, Kaohsiung (TW); Ying-Nan Liu, Kaohsiung (TW); Min-Yao Cheng, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 87 days.

(21) Appl. No.: 17/511,472

(22) Filed: Oct. 26, 2021

(65) Prior Publication Data

US 2022/0052013 A1 Feb. 17, 2022

Related U.S. Application Data

(63) Continuation of application No. 16/825,725, filed on Mar. 20, 2020, now Pat. No. 11,158,596.

(51) Int. Cl.
*H01L 23/00* (2006.01)

(52) U.S. Cl.
CPC .... *H01L 24/35* (2013.01); *H01L 2924/01013* (2013.01); *H01L 2924/01014* (2013.01); *H01L 2924/14* (2013.01); *H01L 2924/19107* (2013.01)

(58) Field of Classification Search
CPC ..................................................... H01L 24/35
USPC ........................................................ 257/678
See application file for complete search history.

(56) References Cited

U.S. PATENT DOCUMENTS

| | | |
|---|---|---|
| 9,892,990 B1* | 2/2018 | Galloway ........... H01L 23/5384 |
| 10,128,764 B1 | 11/2018 | Vinciarelli |
| 2011/0085311 A1 | 4/2011 | Chen |
| 2013/0270691 A1 | 10/2013 | Mallik et al. |
| 2019/0237416 A1* | 8/2019 | Gao .................. H01L 23/49827 |

FOREIGN PATENT DOCUMENTS

DE   10 2010 042 382 A1   4/2012

OTHER PUBLICATIONS

Non-Final Office Action for U.S. Appl. No. 16/825,725, dated Feb. 22, 2021, 17 pages.
U.S. Notice of Allowance for U.S. Appl. No. 16/825,725, dated Jun. 24, 2021, 8 pages.

* cited by examiner

*Primary Examiner* — Ajay Arora
(74) *Attorney, Agent, or Firm* — FOLEY & LARDNER LLP

(57) ABSTRACT

A semiconductor device package is provided. The semiconductor device package includes providing a first substrate, a computing unit and a power module. The first substrate has a first surface and a second surface opposite to the first surface. The computing unit is adjacent to the first surface. The computing unit includes a semiconductor die. The power module is adjacent to the second surface. The power module includes a power element and a passive element. Each of the semiconductor die, the power element, and the passive element is vertically arranged with respect to each other, and the passive elements are assembled between the semiconductor die and the power element.

6 Claims, 9 Drawing Sheets

SEMICONDUCTOR DEVICE PACKAGE COMPRISING POWER MODULE AND PASSIVE ELEMENTS

CROSS-REFERENCE TO RELATED APPLICATION

This application is a continuation of U.S. patent application Ser. No. 16/825,725 filed Mar. 20, 2020, the contents of which is incorporated herein by reference in its entirety.

BACKGROUND

1. Field of the Disclosure

The present disclosure relates to a semiconductor device package, and particularly to a semiconductor device package with passive elements.

2. Description of Related Art

For high performance computing or artificial intelligence (AI) computing, power loss and IR drop are major issues on power routings when current consumption is increased in an ever-decreasing metal line width. To increase the overall efficiency of power delivery system for high performance computing such as CPU, GPU, or TPU, reduction of power loss and enhancement of thermal conduction plays critical role.

Conventionally, lateral power delivery system is integrated with high performance computing semiconductor package, resulting in a long power routing path. Long power routing path generates large power loss and large IR drop when current consumption is high. A vicious cycle triggered by the overall power efficiency reduction, including excessive thermal burden, over-temperature protection that leads to reduction of current, more voltage regulator modules (VRM) are necessary for the power requirement resulting in higher bill of material cost. A new packaging architecture is required to break the vicious cycle by shortening routings on the power delivery.

SUMMARY

According to some embodiments of the present disclosure, a semiconductor device package includes providing a first substrate, a computing unit and a power module. The first substrate has a first surface and a second surface opposite to the first surface. The computing unit is adjacent to the first surface. The computing unit includes a semiconductor die. The power module is adjacent to the second surface. The power module includes a power element and a passive element. Each of the semiconductor die, the power element, and the passive element is vertically arranged with respect to each other, and the passive element is assembled between the semiconductor die and the power element.

According to some embodiments of the present disclosure, a semiconductor device package includes a substrate, a computing unit, a power module and a passive element. The substrate has a first surface and a second surface opposite to the first surface. The computing unit is adjacent to the first surface. The computing unit includes a semiconductor die. The power module is adjacent to the second surface. The power module includes a power element and an inductor stacked with the power element. The passive element is over the power module. Each of the semiconductor die, the power module, and the passive element is vertically arranged with respect to each other, and the inductor is assembled between the semiconductor die and the power element.

According to some embodiments of the present disclosure, a semiconductor device package includes a substrate, a computing unit, a power module and a passive element. The substrate has a first surface and a second surface opposite to the first surface. The computing unit is adjacent to the first surface. The computing unit includes a semiconductor die and a printed circuit board (PCB) under the substrate. The PCB includes a third surface and a fourth surface opposite to the third surface. The power module is adjacent to the fourth surface. The power module includes a power element on the fourth surface and an inductor embedded in the PCB. The passive element is over the power module. Each of the semiconductor die, the power module, the PCB, and the passive element is vertically arranged with respect to each other.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Figure 1:
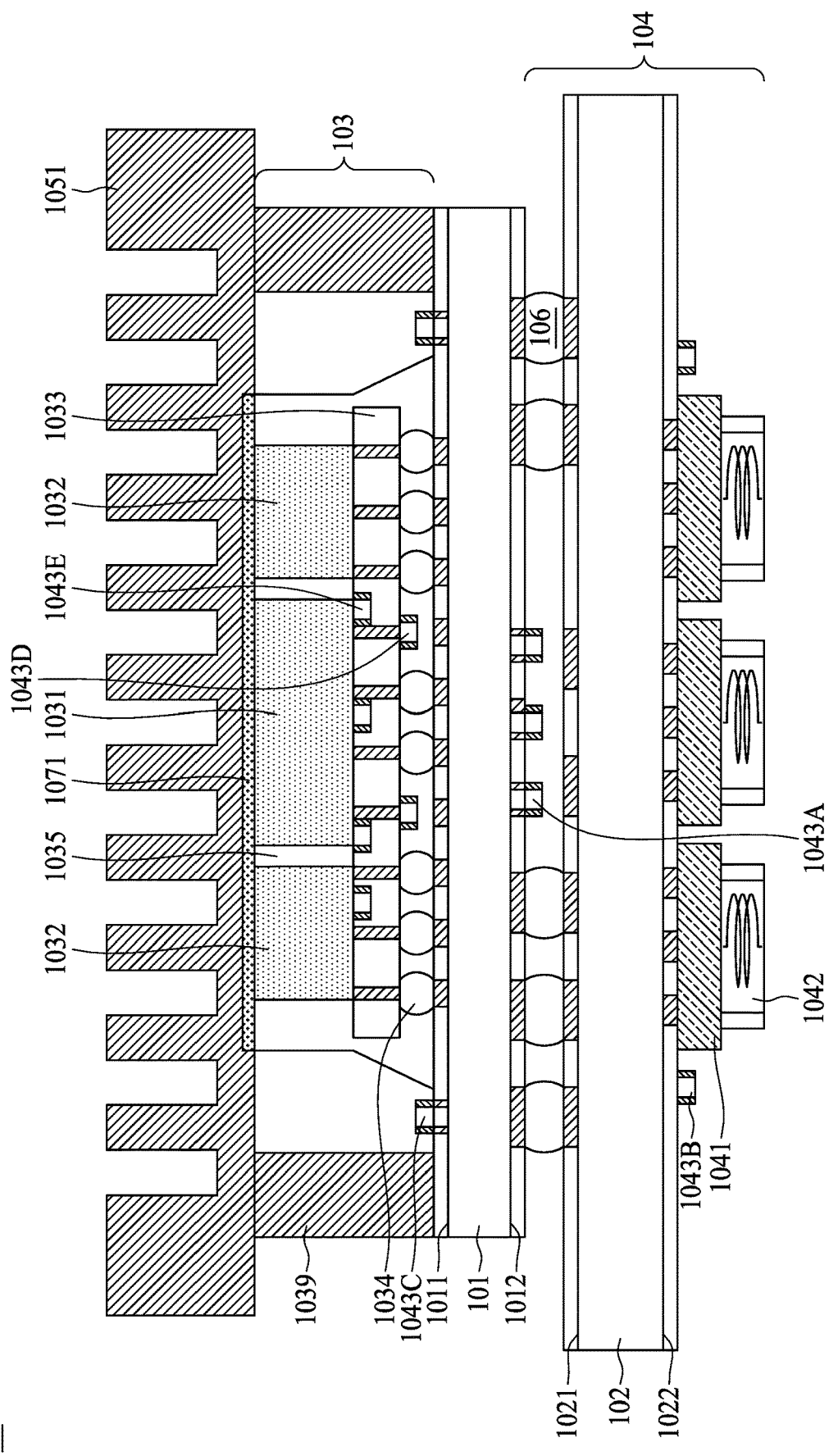
FIG. 1 is a cross-sectional view of a semiconductor device package in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 is a cross-sectional view of a semiconductor device package 10 in accordance with some embodiments of the present disclosure. In some embodiments, the semiconductor device package 10 includes a substrate 101, a computing unit 103 and a power module 104.

The substrate 101 may have a surface 1011 and a surface 1012 opposite to the surface 1011. In some embodiments, the substrate 101 is formed of, for example, a printed circuit board, such as a paper-based copper foil laminate, a composite copper foil laminate, or a polymer-impregnated glass-fiber-based copper foil laminate. The substrate 101 may include a redistribution layer (RDL), traces and pads, for electrical connection between components. In some embodiments, the substrate 101 can be replaced by other suitable carriers, such as a lead frame. In addition, dielectric layers may be disposed on the surfaces 1011 and 1012 to serve as a mask layer protecting the traces and pads on the substrate 101.

The computing unit 103 is adjacent to the surface 1011. The computing unit 103 may include a semiconductor die 1031, a semiconductor die 1032 and an interposer 1033. The semiconductor dies 1031 and/or 1032 may be assembled on the interposer 1033. In some embodiments, the semiconductor dies 1031 and/or 1032 may be assembled on a side of the interposer 1033 far from the substrate 101. The semiconductor dies 1031 and 1032 may be an integrated circuit (IC) chip. In some embodiments, the semiconductor die 1031 may be an application-specific integrated circuit (ASIC) die. In some embodiments, the semiconductor die 1032 may be a memory. The numbers of the semiconductor dies 1031 and 1032 may be modified, and the present disclosure is not limited thereto.

The interposer 1033 may be assembled on the surface 1011 of the substrate 101. The interposer 1033 may include a silicon substrate and a redistribution layer (RDL) therein. The interposer 1033 may be configured to electrically connect the substrate 101 and the semiconductor dies 1031 and/or 1032 through conductive terminals 1034.

The conductive terminals 1034 may be disposed on the surface 1011 of the substrate 101. The conductive terminals 1034 may be mounted on a side of the interposer 1033 close to the substrate 101. The conductive terminal 1034 may be a copper pillar or solder ball, for example, a Sn ball.

The semiconductor device package 10 may include a molding compound 1035. The molding compound 1035 may surround or seal the semiconductor die 1031, the semiconductor die 1032 and the interposer 1033. The molding compound 1035 may be configured to protect the above elements from damage or contamination. The molding compound 1035 may be, or may include, for example, an epoxy resin having fillers, a molding compound (e.g., an epoxy molding compound or other molding compound), a polyimide, a phenolic compound or material, a material with a silicone dispersed therein, or a combination thereof.

The power module 104 is adjacent to the surface 1012 of the substrate 101. The power module 104 may include a power element 1041 and a passive element 1042. The power element 1041 may include a power stage providing power. The power element 1041 may be an integrated power stage (IPS) or a smart power stage (SPS). The IPS or SPS may include drivers and high/low side metal-oxide-semiconductor field-effect transistors (MOSFETs).

In some embodiments, the passive element 1042 may assembled under the power element 1041. In some embodiments, the passive element 1042 may be stacked with the power element 1041. In some embodiments, the passive element 1042 may include an inductor. The passive element 1042 may be configured to transfer magnetic energy to electric potential energy and serve as a transformer.

In some embodiments, each of the semiconductor die 1031 or 1032, the power element 1041, and the passive element 1042 is vertically arranged with respect to each other. In this embodiment, the power, provided by the power element 1041, is transmitted to the semiconductor die 1031 or 1032 through a vertical path, reducing power routing path. Thus, the semiconductor device package 10 provides a less power routing path between the power element and the semiconductor dies, resulting in less power loss and less IR drop even when current consumption is high. In comparison with the conventional semiconductor device package, which provides a lateral power routing path between the power element and semiconductor dies, the semiconductor device package 10 improves total efficiency by reducing equivalent series resistance (ESR), and equivalent series inductance (ESL) on the paths of the overall power delivery In some embodiments, the semiconductor device package 10 includes a substrate 102. In some embodiments, the substrate 102 may include a printed circuit board (PCB). The PCB may include a semiconductor substrate, multiple ICs and traces therein. The substrate 102 may include a surface 1021 and a surface 1022 opposite to the surface 1021. The surface 1021 faces the surface 1012. In addition, dielectric layers may be covered on the surfaces 1021 and 1022. In some embodiments, the power module 104 is adjacent to the surface 1022 of the substrate 102.

In some embodiments, the semiconductor device package 10 includes passive element 1043A, 1043B, 1043C, 1043D and 1043E. In some embodiments, the passive element 1043A, 1043B, 1043C, 1043D and/or 1043E may include various types of capacitors. The passive element 1043A, 1043B, 1043C, 1043D and/or 1043E may serve as, but is not limited to, a de-coupling capacitor, removing noise and stabilizing voltage.

In some embodiments, the passive element 1043A is assembled on or adjacent to the surface 1012 of the substrate 101. In some embodiments, the passive element 1043A is adjacent to the surface 1021 of the substrate 102. In some embodiments, the passive element 1043A is assembled between the substrate 101 and the power element 1041. In this embodiment, each of the passive element 1043A, the passive element 1042, the power element 1041 and the semiconductor die 1031 or 1032 is vertically arranged with respect to each other. In some embodiments, the power element 1041 is electrically connected to the computing unit 103 through the passive elements 1042 and 1043A. In some embodiments, the power element 1041 is electrically connected to the computing unit 103 with the inductors and the capacitors.

The passive element 1043B may be assembled on the surface 1022 of the substrate 102.

The passive element 1043C may be assembled on the surface 1011 of the substrate 101. In some embodiments, the passive element 1043A, 1043B, and/or 1043C may include a micrometer-scale multi-layer ceramic capacitor (MLCC) with larger capacitance. The passive element 1043A, 1043B, and/or 1043C can be configured to, but is not limited to, filter off a lower frequency noises on power delivered paths.

The passive element 1043D may be assembled adjacent to or partially embedded in the interposer 1033 connecting the conductive terminal 1034 and the semiconductor die 1031. The passive element 1043D may be assembled at a side of the interposer 1033 facing the conductive terminal 1034. In some embodiments, the passive element 1043D may be a thin film or a deep trench (TF/DT) capacitor by semiconductor process. The passive element 1043D may be configured to filter off noise at higher frequency than that being filtered by the passive element 1043A, 1043B, and/or 1043C.

The passive element 1043E may be embedded in the interposer 1033 proximal to the side of the interposer 1033 facing the semiconductor die 1031. The passive element 1043E integrated in the interposer 1033 may be a deep trench capacitor (DTC), filtering off noise signal with higher frequency than that being filtered by the passive element 1043A, 1043B, 1043C, and/or 1043D.

In some embodiments, the semiconductor device package 10 includes a heat sink 1051. The heat sink 1051 may be assembled on the surfaces of semiconductor die 1031 and semiconductor die 1032. The heat sink 1051 may be coupled to the computing unit 103 via TIM (Thermal Interface Material). The heat sink 1051 may include, but is not limited to, a solid metal slug or an electrical insulator coated with metallic film. For example, the heat sink 1051 may include copper (Cu), aluminum (Al) and/or other suitable materials. The heat sink 1051 may also include aluminum oxide ($Al_2O_3$), aluminum nitride (AlN), or silicon nitride (SiN) plate coated with copper.

In some embodiments, the semiconductor device package 10 may include a frame 1039 surrounding the semiconductor die 1031 and 1032, the interposer 1033, and the passive elements 1043D and 1043E. The frame 1039 may be disposed to separate the heat sink 1051 and the substrate 101. The frame 1039 may be configured to avoid warpage on the semiconductor device package 10 under a large package size.

The semiconductor device package 10 includes a conductive terminal 106. The conductive terminal 106 may be disposed between the substrate 101 and the substrate 102. The conductive terminal 106 may be a solder ball, for example, a Sn ball. In some embodiments, the height of the conductive terminal 106 is greater than or exceeds the height of the passive element 1043A.

In some embodiments of the present disclosure, the semiconductor device package 10 includes a passive element, such as the passive element 1043E or the passive element 1042, close to the semiconductor die, resulting in lower ESR and/or ESL. Accordingly, the impedance of power delivery on the semiconductor device package 10 can be improved for better noise filtering.

In addition, the semiconductor device package 10 may include a thermal interface material (TIM) 1071 disposed between the heat sink 1051 and the semiconductor die 1031 and/or 1032 in order to facilitate the heat dissipation from the semiconductor die 1032 and 1032 to the heat sink 1051.

Figure 2:
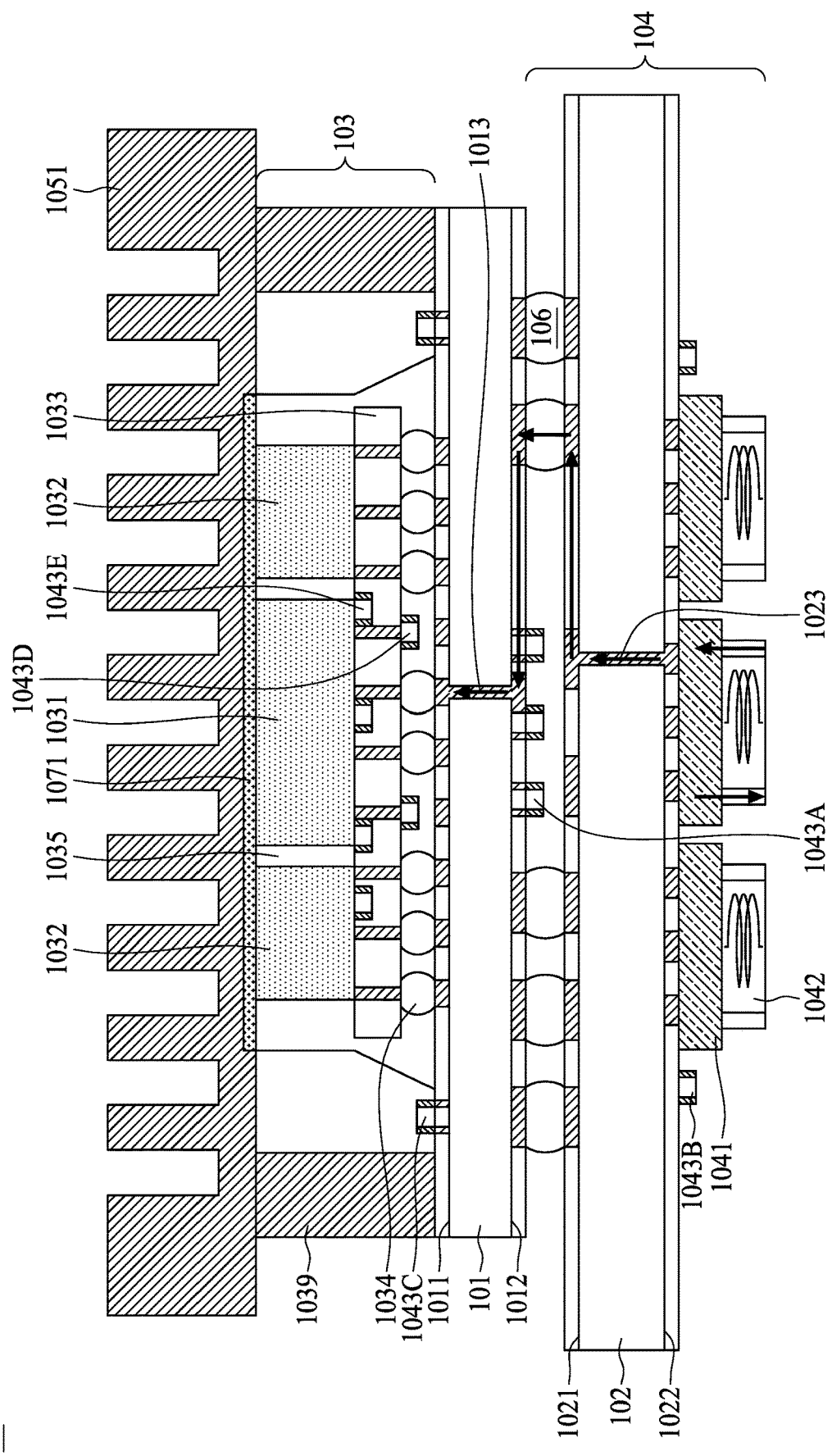
FIG. 2 is a cross-sectional view of a semiconductor device package in accordance with some embodiments of the present disclosure.

FIG. 2 is a cross-sectional view of a semiconductor device package 20 in accordance with some embodiments of the present disclosure. The semiconductor device package 20 of FIG. 2 has a structure similar to that of the semiconductor device package 10 of FIG. 1 but dissecting at a cross section rendering embedded vias 1013 and 1023 connecting opposite surfaces of the substrate 101 and the substrate 102 observable. Vias 1013 and 1023 are configured to transmit electrical signal from the power element 1041 of the power module 104 to the semiconductor die 1032 of the computing unit 103. As shown in FIG. 2, for example, current flowing in the power routing path may set out from the power element 1041, sequentially passing the passive element 1042 (e.g., an inductor), embedded via 1023 in the substrate 102, the conductive terminal 106, the passive element 1043A (e.g., a capacitor), the embedded vias 1013 in the substrate 101, and toward the computing unit 103.

The via 1013 is formed in the substrate 101 and connecting the surface 1011 to the surface 1012. The via 1013 may electrically connect the passive element 1043A and the conductive terminal 1034.

The via 1023 is formed in the substrate 102 and connecting the surface 1021 to the surface 1022. The via 1023 may electrically connect the passive element 1042 and the conductive terminal 106. In some embodiments, the power element 1041 is electrically connected to the semiconductor die 1031 and/or 1032 through the passive element 1042, via 1023, conductive terminal 106, passive element 1043A, via 1013, conductive terminal 1034 and interposer 1033.

Figure 3:
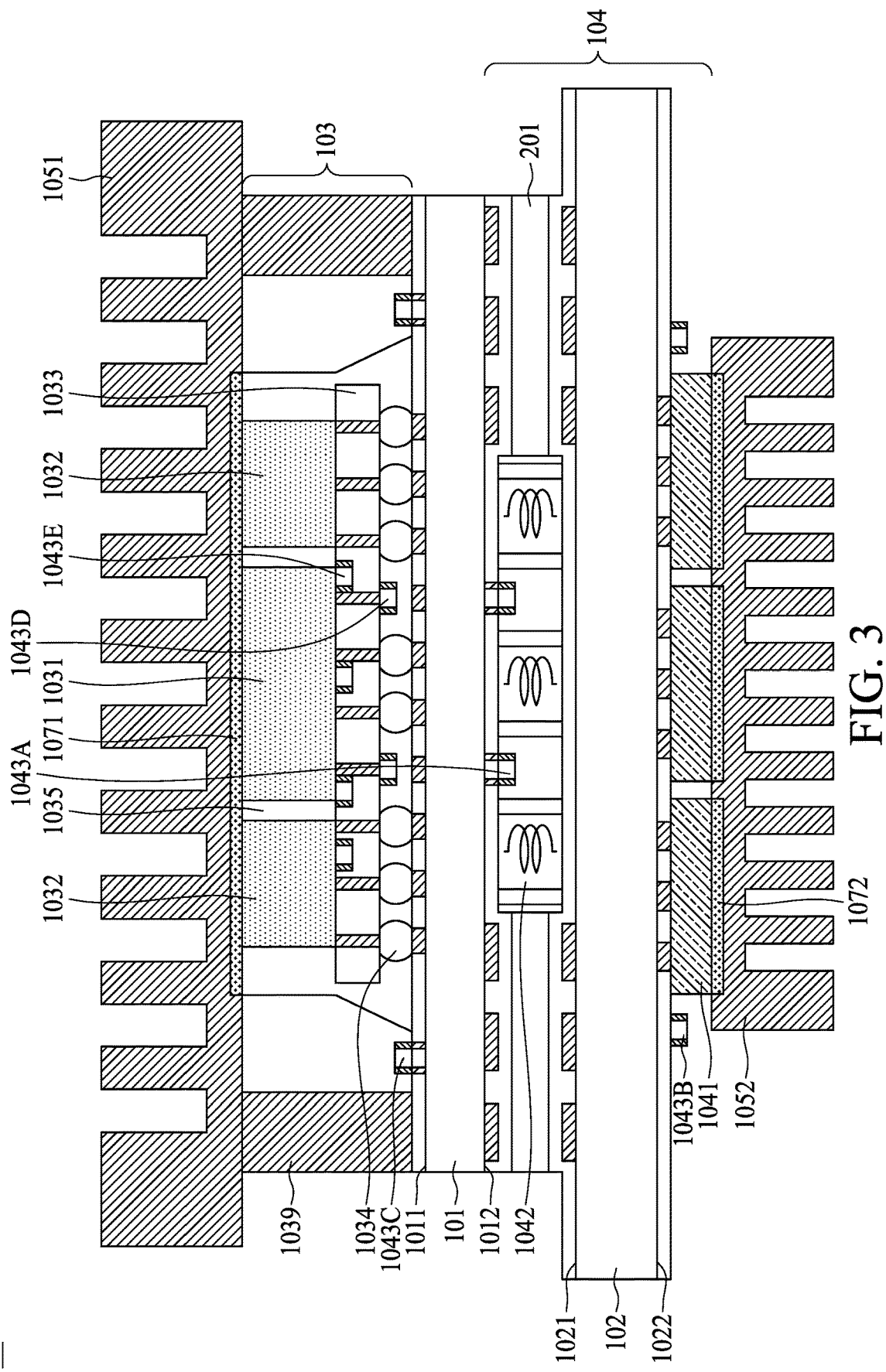
FIG. 3 is a cross-sectional view of a semiconductor device package in accordance with some embodiments of the present disclosure.

FIG. 3 is a cross-sectional view of a semiconductor device package 30 in accordance with some embodiments of the present disclosure. The semiconductor device package 30 of FIG. 3 has a structure similar to that of the semiconductor device package 10 of FIG. 1, and one of differences is that the passive element 1042 of the semiconductor device package 30 is assembled between the substrate 101 and the substrate 102.

In some embodiments, the semiconductor device package 30 includes a cavity substrate 201. The cavity substrate 201 may be assembled between the substrate 101 and the substrate 102. The cavity substrate 201 may include a PCB or other suitable substrates. The cavity substrate 201 may include RDL or traces therein. The cavity substrate 201 may surround the passive element 1043A. The cavity substrate 201 may surround the passive element 1042. In some embodiments, the cavity substrate 201 includes a cavity accommodating the passive element 1043A and/or the passive element 1042.

In some embodiments, the passive elements 1042 and 1043A may be assembled in the cavity of the cavity substrate 201. The passive elements 1042 and 1043A may be arranged alternatively along a lateral direction. In some embodiments, the passive element 1042 is assembled between the power element 1041 and the semiconductor die 1031 or 1032. In this embodiment, since the passive element 1042 is much closer to the semiconductor die 1031 or 1032, for better noise filtering.

In some embodiments, the semiconductor device package 30 includes a heat sink 1052. The heat sink 1052 may be assembled on or in contact with the power element 1041 with TIM (Thermal Interface Material). The material of the heat sink 1052 may be similar to or the same as that of the heat sink 1051, and is not repeated herein. In this embodiment, heat can be dissipated from two sides of the semiconductor device package 30, thereby improving efficiency of the semiconductor device package 30.

In addition, the semiconductor device package 30 may include a TIM 1072 disposed between the heat sink 1052 and the power element 1041.

Figure 4:
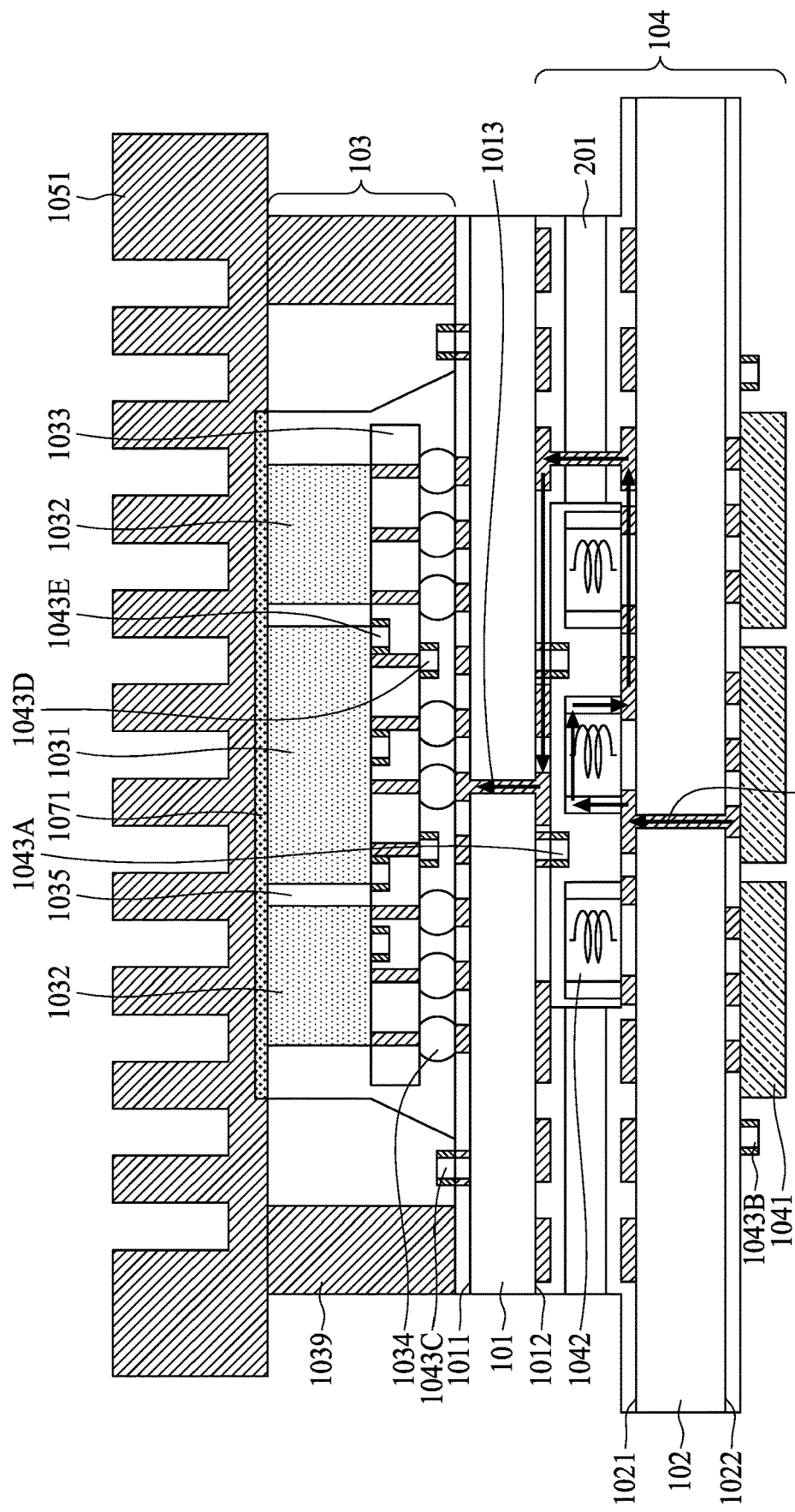
FIG. 4 is a cross-sectional view of a semiconductor device package in accordance with some embodiments of the present disclosure.

FIG. 4 is a cross-sectional view of a semiconductor device package 40 in accordance with some embodiments of the present disclosure. The semiconductor device package 40 of FIG. 4 has a structure similar to that of the semiconductor device package 30 of FIG. 3, and one of differences is that an electrical terminal of the passive element 1042 of the semiconductor device package 40 is in contact with an electrical terminal of the surface 1021 of the substrate 102. For example, an electrical terminal of the passive element 1042 (e.g., an inductor assembled in the cavity substrate 201) is in physical contact with a conductive trace at the surface 1021 of the substrate 102. The physical contact between electrical terminal of the passive element 1042 and the surface 1021 of the substrate 102 effectively shorten the power routing path of the semiconductor device package 40.

As shown in FIG. 4, for example, current flowing in the power routing path may set out from the power element 1041, sequentially passing the embedded via 1023 in the substrate 102, the passive element 1042 (e.g., an inductor), the embedded via in the cavity substrate 201, the passive element 1043A (e.g., a capacitor), the embedded via 1013 in the substrate 101, and toward the computing unit 103. The vertical stacking architecture including physical contact between the inductor and the substrate forms a shorter power routing path compared with that in the semiconductor device package 20 of FIG. 2.

In some embodiments, the passive element 1042 is electrically connected to the power element 1041 through the via 1023. In some embodiments, the power element 1041 is electrically connected to the semiconductor die 1031 or 1032 through the via 1023, passive element 1042, passive element 1043A, via 1013 and conductive terminal 1034.

Figure 5:
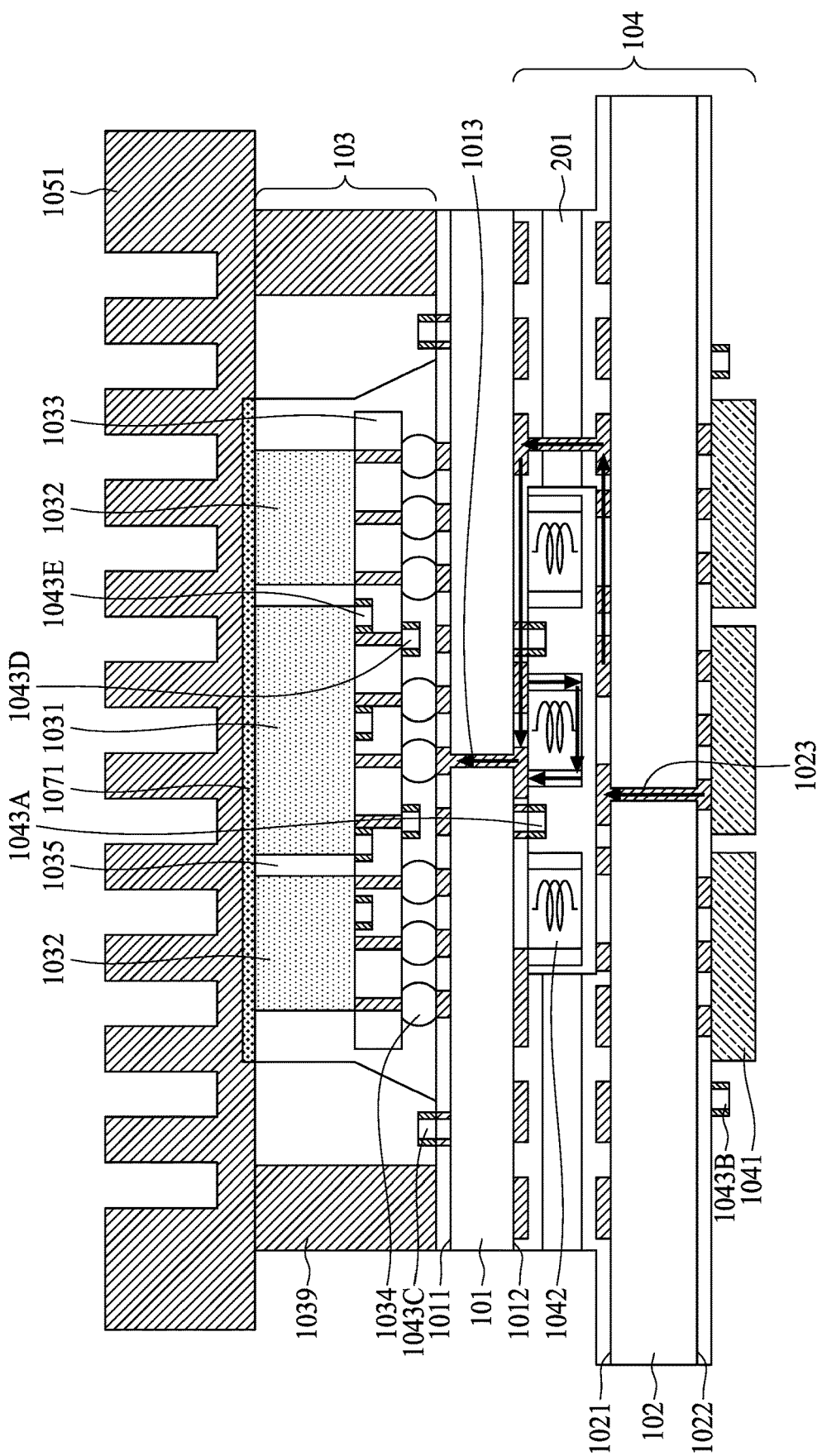
FIG. 5 is a cross-sectional view of a semiconductor device package in accordance with some embodiments of the present disclosure.

FIG. 5 is a cross-sectional view of a semiconductor device package 50 in accordance with some embodiments of the present disclosure. The semiconductor device package 50 of FIG. 5 has a structure similar to that of the semiconductor device package 40 of FIG. 4, and one of differences is that an electrical terminal of the passive element 1042 of the semiconductor device package 50 is in contact with an electrical terminal of the surface 1012 of the substrate 101. For example, an electrical terminal of the passive element 1042 (e.g., an inductor assembled in the cavity substrate 201) is in physical contact with a conductive trace at the surface 1012 of the substrate 101. The physical contact between electrical terminal of the passive element 1042 and the surface 1012 of the substrate 101 effectively shorten the power routing path of the semiconductor device package 50.

As shown in FIG. 5, for example, current flowing in the power routing path may set out from the power element 1041, sequentially passing the embedded via 1023 in the substrate 102, the embedded traces in the cavity substrate 201, the passive element 1043A (e.g., a capacitor), the passive element 1042 (e.g., an inductor), the embedded via 1013 in the substrate 101, and toward the computing unit 103. The vertical stacking architecture including physical contact between the inductor and the substrate forms a shorter power routing path compared with that in the semiconductor device package 20 of FIG. 2.

Figure 6:
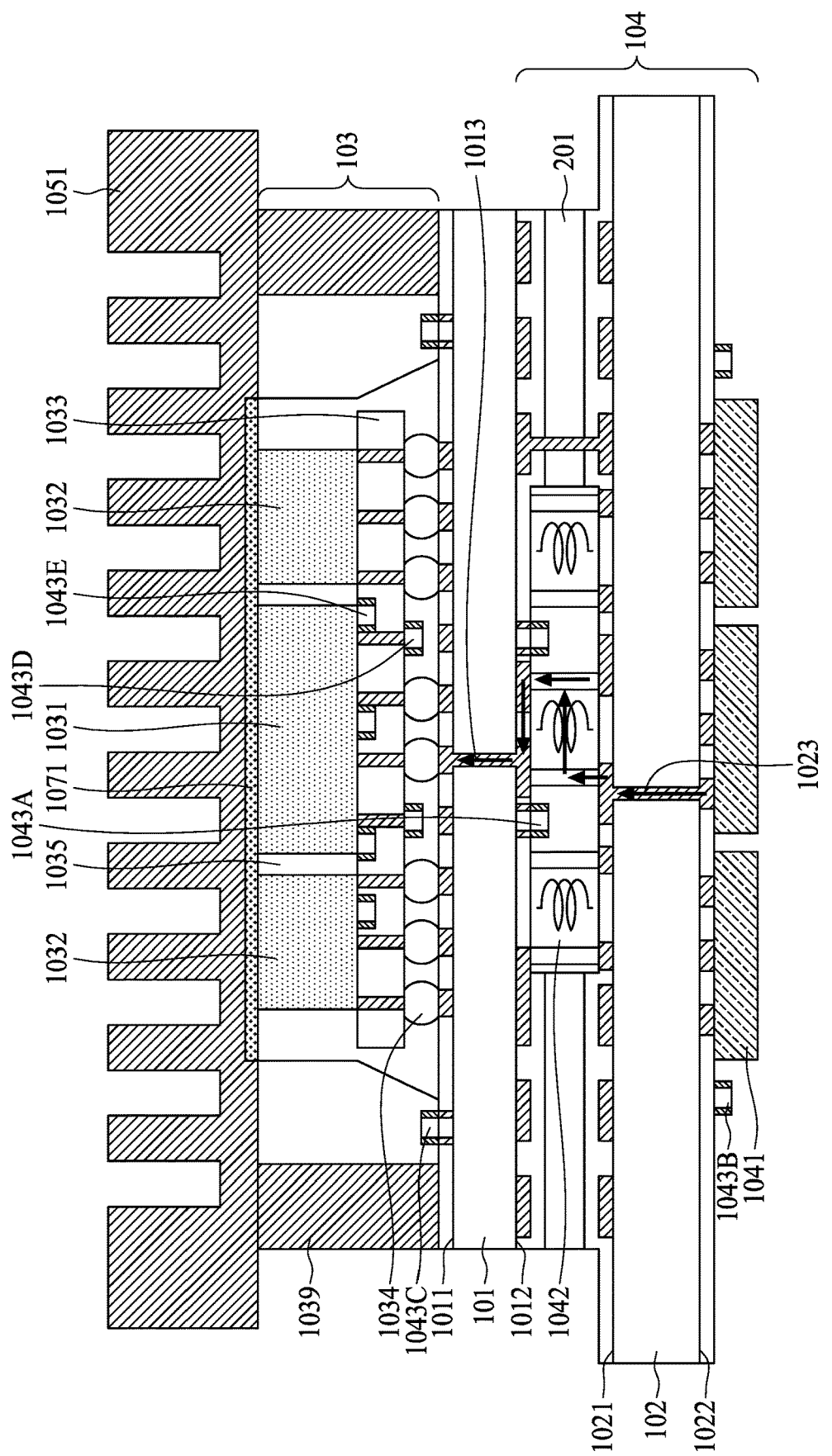
FIG. 6 is a cross-sectional view of a semiconductor device package in accordance with some embodiments of the present disclosure.

FIG. 6 is a cross-sectional view of a semiconductor device package 60 in accordance with some embodiments of the present disclosure. The semiconductor device package 60 of FIG. 6 has a structure similar to that of the semiconductor device package 40 of FIG. 4, and one of differences is that an electrical terminal of the passive element 1042 of the semiconductor device package 60 is in contact with an electrical terminal of both the surface 1012 and the surface 1021. For example, an electrical terminal of the passive element 1042 (e.g., an inductor assembled in the cavity substrate 201) is in physical contact with a conductive trace at the surface 1021 of the substrate 102 and the conductive trace at the surface 1012 of the substrate 101. The physical contact between electrical terminal of the passive element 1042 and the surfaces 1021, 1012 of the substrates 102, 101 effectively shorten the power routing path of the semiconductor device package 60.

As shown in FIG. 6, for example, current flowing in the power routing path may set out from the power element 1041, sequentially passing the embedded via 1023 in the substrate 102, the passive element 1042 (e.g., an inductor), the passive element 1043A (e.g., a capacitor), the embedded via 1013 in the substrate 101, and toward the computing unit 103. The vertical stacking architecture including physical contact between the inductor and the substrate forms a shorter power routing path compared with that in the semiconductor device package 20 of FIG. 2.

Figure 7:
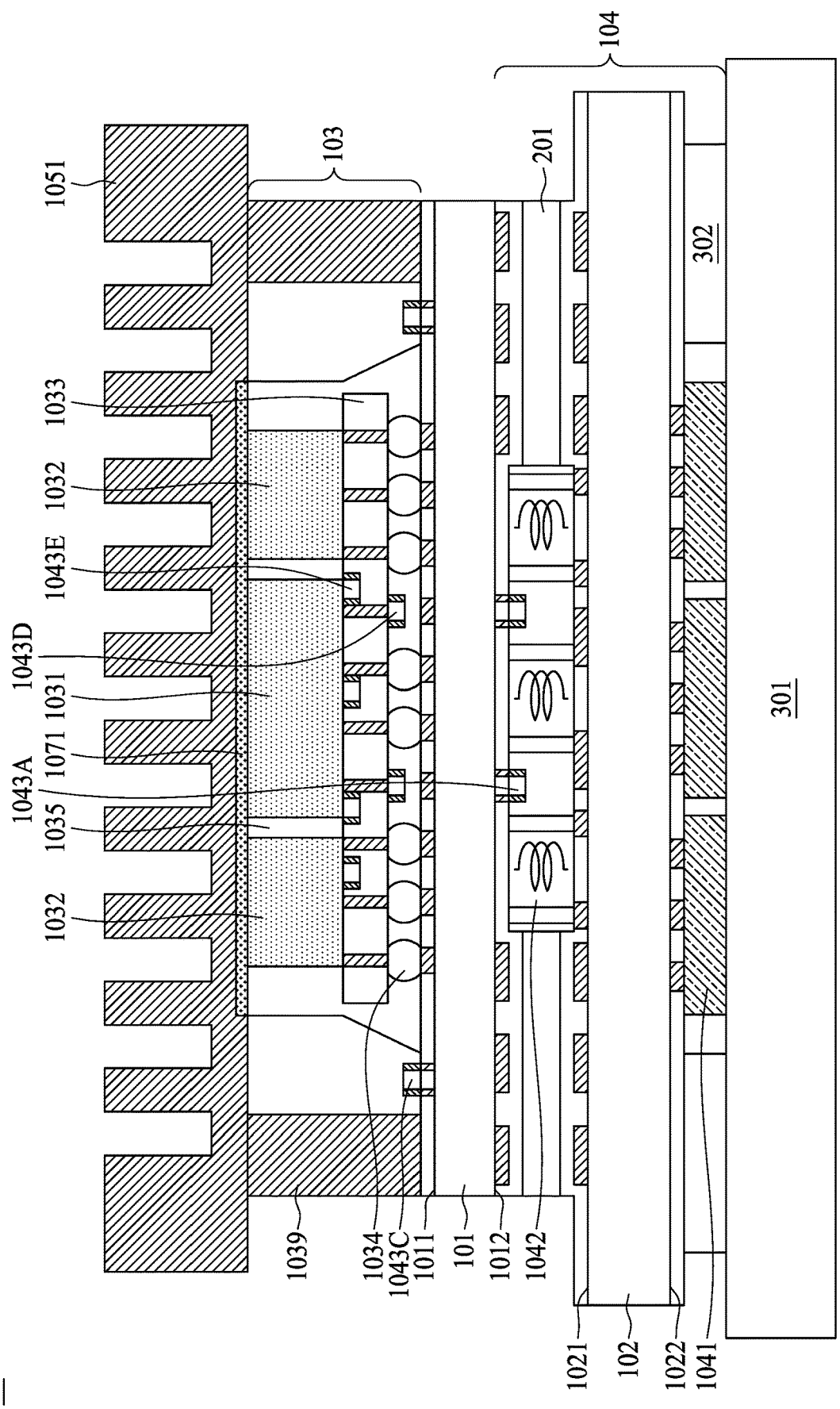
FIG. 7 is a cross-sectional view of a semiconductor device package in accordance with some embodiments of the present disclosure.

FIG. 7 is a cross-sectional view of a semiconductor device package 70 in accordance with some embodiments of the present disclosure. The semiconductor device package 70 of FIG. 7 has a structure similar to that of the semiconductor device package 30 of FIG. 3, and one of differences is that the semiconductor device package 70 replaces the heat sink 1052 with a substrate 301, or a mother board.

The substrate 301 may include a PCB or other suitable substrates. The substrate 301 may include a RDL and/or traces therein. In some embodiments, the power element 1041 may be assembled on the substrate 301. The substrate 301, or a mother board, may also facilitate in spreading the heat generated from the power element 1041 and provide a flat bottom surface to the semiconductor device package 70.

The semiconductor device package 70 may include a socket 302. The socket 302 is assembled on the substrate 301. The socket 302 may be assembled between the substrate 102 and the substrate 301. In some embodiments, the socket 302 includes a cavity accommodating the power element 1041.

Figure 8:
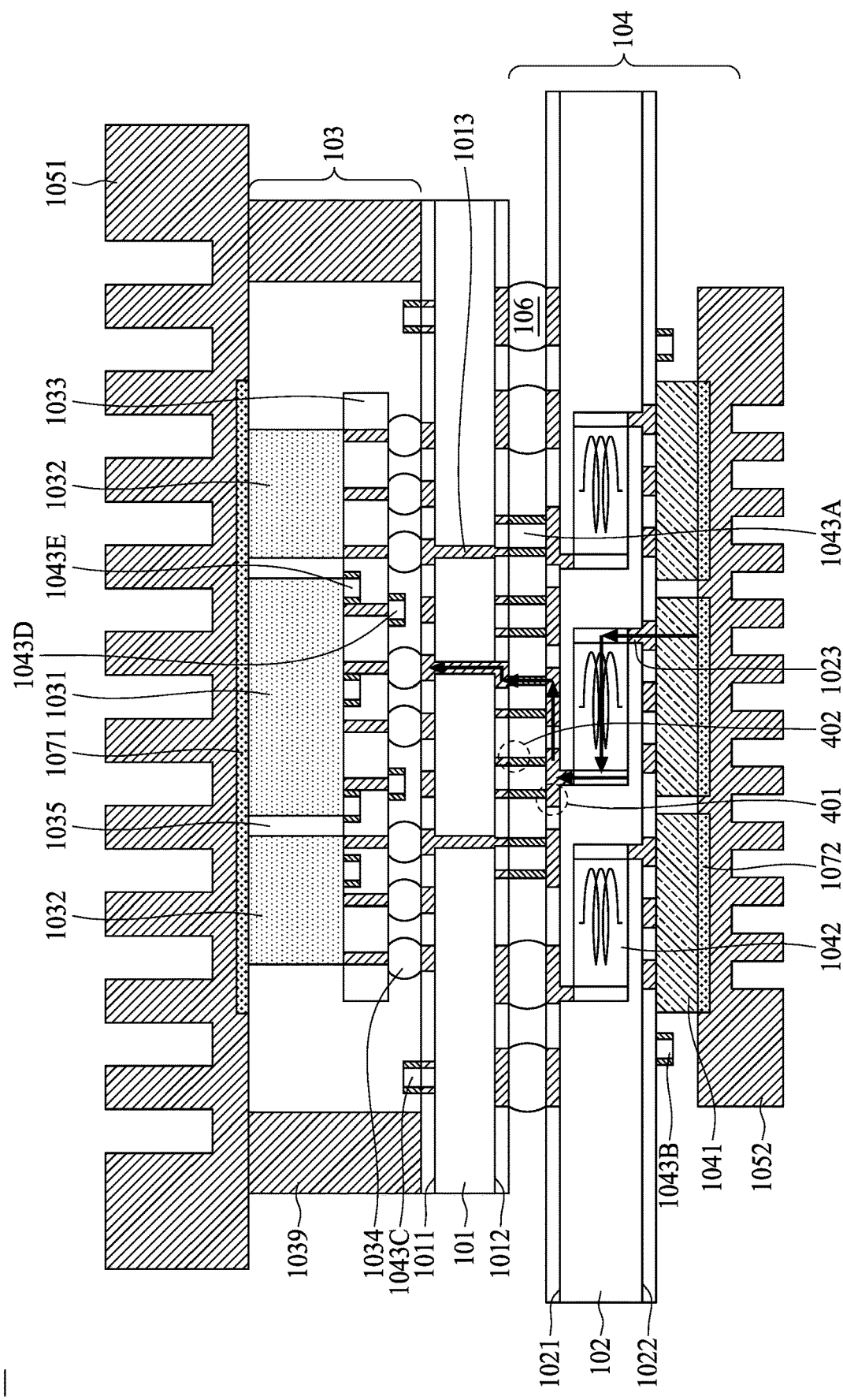
FIG. 8 is a cross-sectional view of a semiconductor device package in accordance with some embodiments of the present disclosure.

FIG. 8 is a cross-sectional view of a semiconductor device package 80 in accordance with some embodiments of the present disclosure. The semiconductor device package 80 of FIG. 8 has a structure similar to that of the semiconductor device package 20 of FIG. 2, and one of differences is that the passive element 1042 of the semiconductor device package 80 is embedded in the substrate 102.

As shown in FIG. 8, for example, current flowing in the power routing path may set out from the power element 1041, sequentially passing the passive element 1042 (e.g., an inductor) embedded in the substrate 102, the passive element 1043A (e.g., a capacitor), the embedded vias 1013 in the substrate 101, and toward the computing unit 103. The vertical stacking architecture including physical contact between the inductor and the substrate forms a shorter power routing path compared with that in the semiconductor device package 20 of FIG. 2.

In some embodiments, the passive element 1043A (e.g., a capacitor) may include electrical terminals. The contacting point 401 of the electrical terminal of the passive element 1043A may be in contact with the electrical terminal of the surface 1021 of the substrate 102. Similarly, the contacting point 402 of the electrical terminal of the passive element 1043A may be in contact with the surface 1012 of the substrate 101. In some embodiments, the height of the conductive terminal 106 is substantially the same as the height of the passive element 1043A.

In this embodiment, the semiconductor device package 80 can provide a much shorter power routing path between the power element 1041 and the semiconductor die 1031 or 1032. Therefore, power loss on the power delivery can further be reduced.

Figure 9:
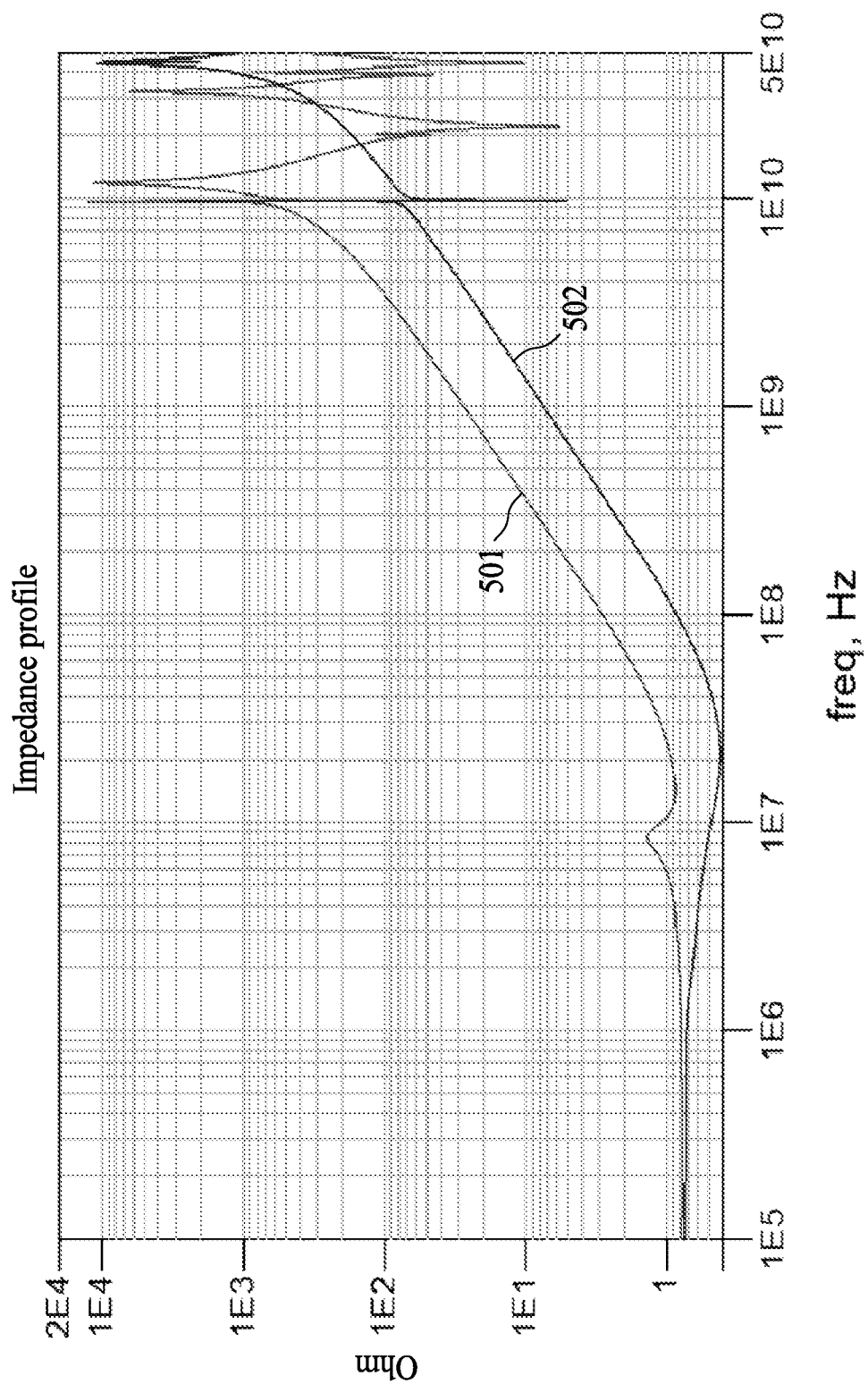
FIG. 9 is an impedance profile showing semiconductor device package in accordance with some embodiments of the present disclosure and the comparative example.

FIG. 9 is an impedance profile of impedance on the power delivery with respect to frequency. The X-axis indicates the magnitude of working frequency, while the Y-axis indicates the magnitude of impedance. Line 501 is a simulation curve of a conventional semiconductor device package including only MLCC as a passive element on the substrate 101. Line 502 is a simulated curve of a semiconductor device package, such as the semiconductor device packages described herein, which include various types of capacitors (e.g., MLCC, DTC and TF/DT capacitors). In comparison with the conventional semiconductor device package, the semiconductor device packages described herein can provide a much less impedance even in high working frequency, evidencing a better noises filtering.

The embodiments of the present disclosure provides a semiconductor device package with shortened power routing path. Lateral power delivery system in the conventional package architecture is replaced with a vertical power delivery system that effectively reduces equivalent series resistance (ESR) and equivalent series inductance (ESL) by 66% and 42.8%, respectively. Power loss and IR drop can be reduced, and the overall power efficiency is raised by about 2% to 5.5%. For example, the vertical power delivery system integrates semiconductor dies and the power stage unit along a vertical direction.

In addition, under the high power computing package framework, normally 16-24 chips are already assembled on the PCB that generate considerable amount of heat. Therefore, power stage unit of the present disclosure is assembled on a side of the PCB distal from the semiconductor dies and optionally, attached with a heat sink.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity exceeding approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
   a first substrate having a first surface and a second surface opposite to the first surface,
   a first passive element disposed on the first substrate;
   a second substrate having a third surface and a fourth surface opposite to the third surface, the third surface facing the second surface of the first substrate,
   a power element being adjacent to the fourth surface;
   a via embedded in the second substrate and disposed between the first passive element and the power element; and
   a die adjacent to the first surface of the first substrate, wherein a projection of the die, a projection of the first passive element, and a projection of the power element on the first substrate overlap each other.

2. The semiconductor device package of claim 1, wherein the power element is disposed on the fourth surface of the second substrate.

3. The semiconductor device package of claim 1, wherein the first passive element is disposed between the die and the power element.

4. The semiconductor device package of claim 1, further comprising:
   a conductive terminal disposed between and electrically connecting the first substrate and the second substrate.

5. The semiconductor device package of claim 1, further comprising:
   a second passive element disposed on the fourth surface of the second substrate and electrically connected to the power element.

6. The semiconductor device package of claim 5, wherein the second passive element comprises an inductor stacked with the power element.

* * * * *